United States Patent
Zhou

(10) Patent No.: US 6,847,240 B1
(45) Date of Patent: Jan. 25, 2005

(54) POWER-ON-RESET CIRCUIT WITH TEMPERATURE COMPENSATION

(75) Inventor: Shi-dong Zhou, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/410,095

(22) Filed: Apr. 8, 2003

(51) Int. Cl.[7] .................................................. H03L 7/00
(52) U.S. Cl. ........................................ 327/143; 327/539
(58) Field of Search ............................... 327/143, 198, 327/539; 323/313

(56) References Cited

U.S. PATENT DOCUMENTS

| | | | |
|---|---|---|---|
| 5,477,176 A | 12/1995 | Chang et al. | 327/143 |
| 5,497,112 A | 3/1996 | Hoang | 327/143 |
| 5,867,047 A * | 2/1999 | Kraus | 327/143 |
| 6,239,630 B1 | 5/2001 | Bowers et al. | 327/143 |
| 6,323,630 B1 | 11/2001 | Banba | 327/143 |
| 6,377,090 B1 | 4/2002 | Bruno | 323/313 |
| 6,472,912 B1 | 10/2002 | Chiu et al. | 327/143 |
| 6,489,835 B1 | 12/2002 | Yu et al. | 323/539 |
| 6,509,768 B2 | 1/2003 | Polizzi et al. | 327/143 |

* cited by examiner

*Primary Examiner*—Quan Tra
(74) *Attorney, Agent, or Firm*—Arthur Joseph Behiel; Jeannette S. Harms

(57) ABSTRACT

Described are power-on reset methods and circuits for resetting and subsequently enabling integrated circuits in response to applied power. A POR circuit in accordance with one embodiment is capable of operating at exceptionally low temperatures and supply voltages, and is relatively tolerant to process variations. The POR circuit compares a band-gap reference signal to a temperature-compensated reference signal that varies in inverse proportion to temperature. The temperature-compensated reference signal extends the useful temperature range of the POR circuit.

9 Claims, 3 Drawing Sheets

POWER-ON-RESET CIRCUIT WITH TEMPERATURE COMPENSATION

BACKGROUND

Band-gap reference (BGR) circuits provide stable reference voltages that vary little with process, supply-voltage, and temperature (PVT). Many circuits—including dynamic random-access memories, flash memories, and analog devices—employ BGR circuits.

The band-gap voltage Vbg of conventional BGR circuits is typically about 1.25 volts. Modern integrated circuits, however, are using ever-lower supply voltages, putting downward pressure on the output voltage of BGR circuits. Some modern devices, for example, employ 1.2-volt power supplies (e.g., Vdd is 1.2 volts), making it impractical to derive a 1.25-volt BGR voltage. Researchers have therefore directed their attention to the creation of BGR circuits with reduced band-gap voltage levels. For a more detailed discussion of BGR circuits, see U.S. Pat. No. 6,489,835 to Yu et al. and U.S. Pat. No. 6,323,630 to Banba, both of which are incorporated herein by reference.

FIG. 1A (prior art) depicts a BGR circuit 100 capable of producing a stable BGR voltage with supply voltages below one volt. A differential amplifier Da1 receives a pair of input voltages Va and Vb. Input voltage va is derived, in part, from the forward voltage Vf1 of a diode D1, while input voltage Vb is derived, in part, from the forward voltage Vf2 of a collection of N diodes D2. The output from differential amplifier Da1 provides the requisite gate bias for PMOS transistors P1, P2, and P3 to maintain the equivalence of input voltages Va and Vb (i.e., Va=Vb). PMOS transistors P1, P2, and P3 are identical and have the same bias voltages, so their respective currents I1, I2, and I3 are equal (i.e., I1=I2=I3).

The input terminals of differential amplifier Da1 connect to the drains of respective transistors P1 and P2 via respective voltage dividers R4 (resistors R4$a$ and R4$b$) and R2 (resistors R2$a$ and R2$b$). Assuming R2$a$=R4$a$ and R2$b$=R4$b$ gives:

$I1a=I2a$ $I1b=I2b$ $Va=Vf1[R4b/(R4a+R4b)]$ $Vb=Vf2+dvf[R2b/(R2a+R2b)]$ $dVf=Vf1-Vf2$ Because the voltage across R1 is dVf, this gives:

$I2a=dVf/R1$ $I2b=Vf1/(R2a+R2b)$

Thus, $I2=I2a+I2b=[Vf1/(R2a+R2b)]+dvf/R1$

---

Vref = R3*I3=R3*I2
   = R3{[Vf1/(R2a+R2b)] + (dVf/R1)}
   = [R3/(R2a+R2b)] * {Vf1+[dVf(R2a+R2b)/R1]}

---

The resistance ratio (R2$a$+R2$b$)/R1 can be set so that vref is not temperature dependent, and the resistance ratio R3/(R2$a$+R2$b$) can be used to adjust the Vref level within the range of the power supply. Voltage dividers R4 and R2 reduce voltages Va and Vb below Vf1, which may be advantageous for very low Vdd levels. The ratio between R2$a$ and R2$b$ (and similarly between R4$a$ and R4$b$) is optimized for a given application. BGR circuit 100 is discussed in more detail in the above-referenced Banba patent.

FIG. 1B is waveform diagram 150 approximating a pair of simulated responses of BGR circuit 100 to the application of a 1.8-volt supply voltage Vdd. (As with other designations in the present disclosure, Vdd refers to both the signal and the corresponding signal node. Whether a given designation refers to a signal or a node will be clear from the context.)

Diagram 150 includes two response curves: a first curve 160 depicts the response of BGR signal Vbg to the application of supply voltage Vdd at a first temperature, and a second curve 165 depicts the response of BGR signal Vbg to the application of the same supply voltage Vdd at a second, lower temperature. The slower response of curve 165 indicates that the response of BGR circuit 100 shifts later in time with reduced temperatures. This shift occurs because the forward voltages vf of diodes D1 and D2 increase with reduced temperature, so Vdd must rise higher before diodes D1 and D2 conduct.

Typical integrated circuits (ICs) function over a range of power-supply voltages, and can be expected to fail if operating with supply voltage outside this range. ICs therefore commonly include a so-called "Power-On-Reset" (POR) circuit that resets the IC to a known state upon application of power and holds the known state until the power supply voltages settle at or near some predetermined level. Typically, the POR circuit is powered by the same source as the rest of the IC.

FIG. 2A depicts a conventional POR circuit 200, which includes a BGR circuit 200, a voltage comparator 210 (a differential amplifier), and a voltage divider 215 connected between supply voltage Vdd and ground. BGR 205 provides a BGR signal Vbg to the non-inverting input of comparator 210; voltage divider 215 provides a reference voltage Va, a fraction of supply voltage Vdd, to the inverting input of comparator 210. Comparator 210 compares band-gap voltage Vbg and reference voltage Va to generate a POR signal.

FIG. 2B is a waveform diagram 220 depicting the response of POR circuit 200 to power applied to supply terminals vdd and ground, at time zero, to produce a rising potential difference between vdd and ground. For illustrative purposes, supply voltage Vdd is assumed to rise linearly from zero to 1.8 volts over a power-up time of about 300 microseconds (line 225). BGR circuit 205 can be any of many such circuits, but is assumed to be like BGR circuit 100 for this illustration. Response curves 160 and 165 of BGR circuit 100 are therefore included in FIG. 2B.

Reference voltage Va is merely a divided version of supply voltage Vdd, and thus increases linearly in proportion to Vdd as Vdd ramps up from zero to 1.8 volts. In contrast, BGR signal Vbg ramps up in a non-linear fashion due to the non-linear components (diodes and transistors) employed to generate BGR signal Vbg. The level of BGR signal Vbg can therefore cross the level of reference voltage Va a number of times, producing one or more undesirable "windows" W in the POR signal. In this example, the low-temperature Vbg curve 165 produces a troublesome window, but the higher temperature Vbg curve 160 does not. The relationship between reference voltage va and curves 160 and 165 illustrate that POR circuits are especially susceptible to producing windows when operating at extreme values of process, temperature, and voltage. If such windows are unavoidable, it is preferred that they disappear early and at a relatively low vdd value.

SUMMARY

The present invention is directed to power-on reset (POR) methods and circuits for resetting and subsequently enabling integrated circuits in response to applied power. A POR circuit in accordance with one embodiment is capable of operating at exceptionally low temperatures and supply voltages, and is relatively tolerant to process variations. To achieve these benefits, the POR circuit compares a conventional BGR signal with a temperature-compensated reference signal that varies in inverse proportion to temperature.

The claims, and not this summary, define the scope of the invention.

DETAILED DESCRIPTION

Figure 1A:
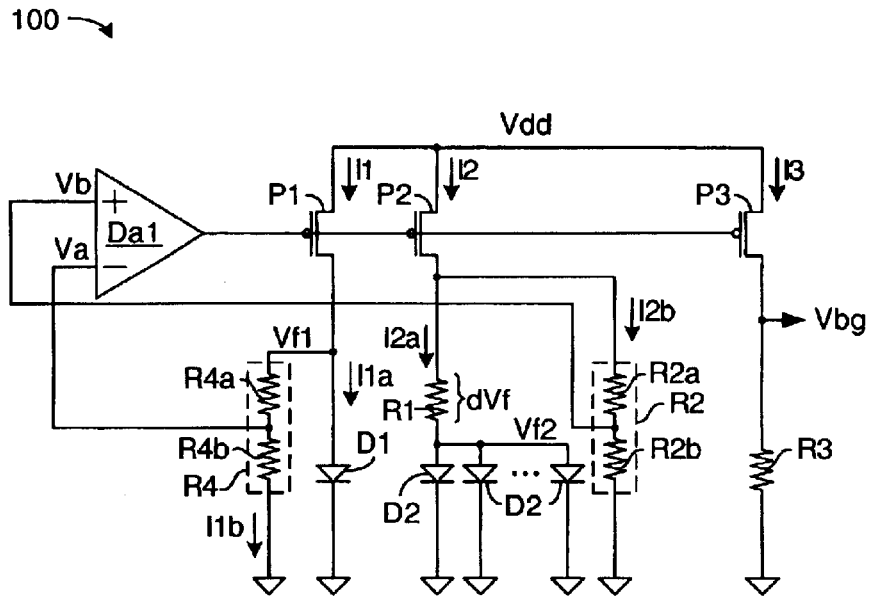
FIG. 1A (prior art) depicts a BGR circuit 100 capable of producing a stable band gap voltage with supply voltages below one volt.
Figure 1B:
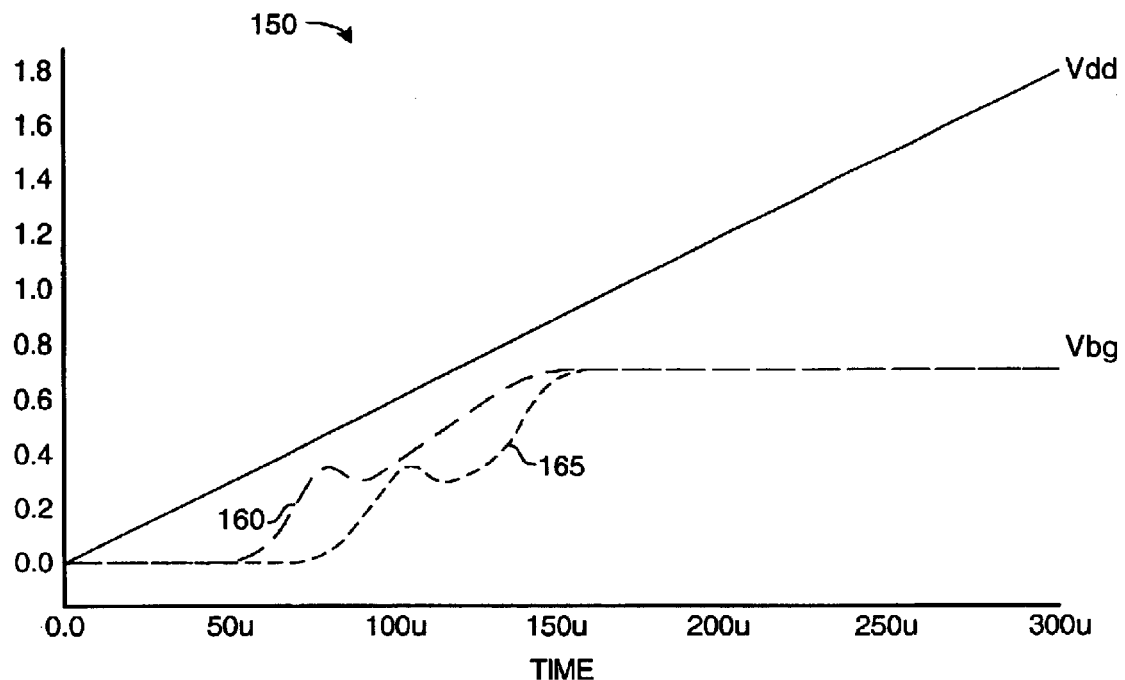
FIG. 1B is waveform diagram 150 approximating simulated responses of BGR circuit 100 to the application of a 1.8-volt supply voltage vdd.
Figure 2A:
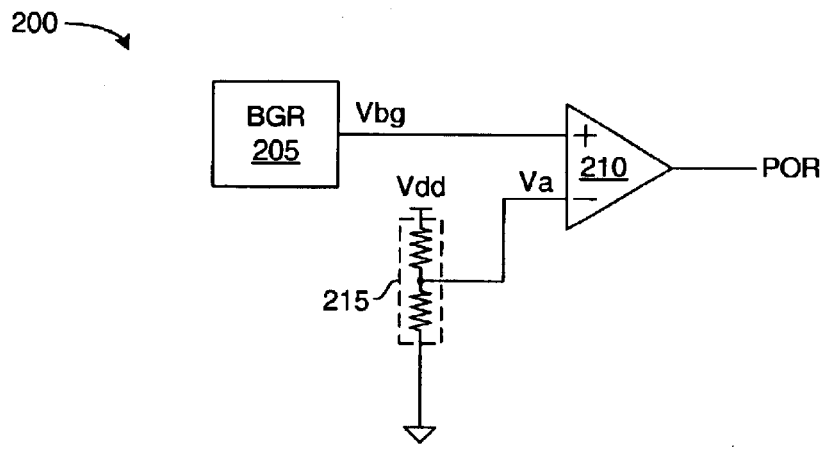
FIG. 2A depicts a conventional POR circuit 200.
Figure 3A:
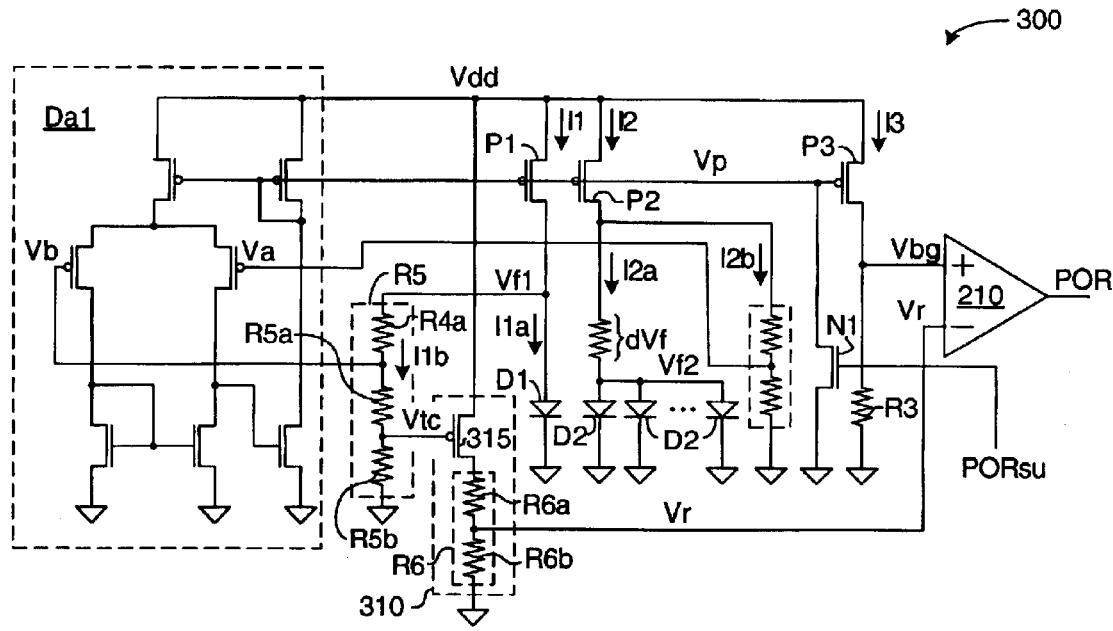
FIG. 3A depicts a power-on-reset (POR) circuit 300 in accordance with one embodiment of the invention.

FIG. 3A depicts a power-on-reset (POR) circuit 300 in accordance with one embodiment of the invention. POR circuit 300 is capable of operating at exceptionally low temperatures and operating voltages, and is relatively tolerant of process variations. As in the conventional POR circuit 200 of FIG. 2A, POR circuit 300 includes a comparator that compares a BGR signal Vbg to a second reference voltage to produce a POR signal. As detailed below, however, the second reference signal Vr in POR circuit 300 is non-linear with respect to vdd, and this nonlinearity compensates for temperature variation that might otherwise lead to undesirable windows in the POR signal.

POR circuit 300 includes many components in common with POR circuit 200 of FIG. 2, like-identified elements being the same or similar. POR circuit 300 is modified, however, to include a second reference circuit 310 that produces a temperature-compensated second reference signal Vr. Reference circuit 310 includes a PMOS transistor 315 in which the source (a first current-handling terminal) is connected to Vdd (a first power-supply terminal), the drain (a second current-handling terminal) is connected to ground (a second power-supply terminal), and the gate (a control terminal) is connected to a temperature-compensated control terminal Vtc. A voltage divider R5 divides the voltage across diode D1, producing control signal Vtc on an intermediate voltage-divider terminal. The forward voltage vf1 across D1 is inversely proportional to temperature, so control signal Vtc is likewise inversely proportional to temperature. Control signal Vtc is substantially constant with variations in power-supply voltage once Vdd exceeds Vtc by the threshold voltage Vtp of PMOS transistor 315. The drain of transistor 315 connects to ground via a voltage divider R6 that produces, on an intermediate node defined between resistors R6a and R6b, the non-linear reference signal vr to comparator 210.

Figure 2B:
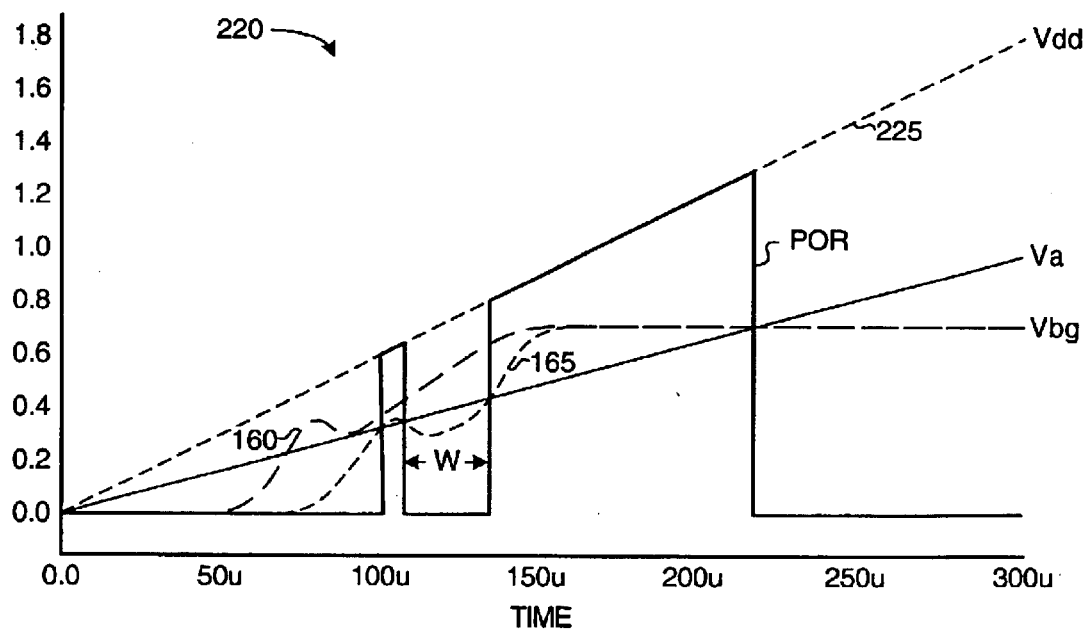
FIG. 2B depicts the response of POR circuit 200 of FIG. 2A to power applied to supply terminal vdd at time zero.
Figure 3B:
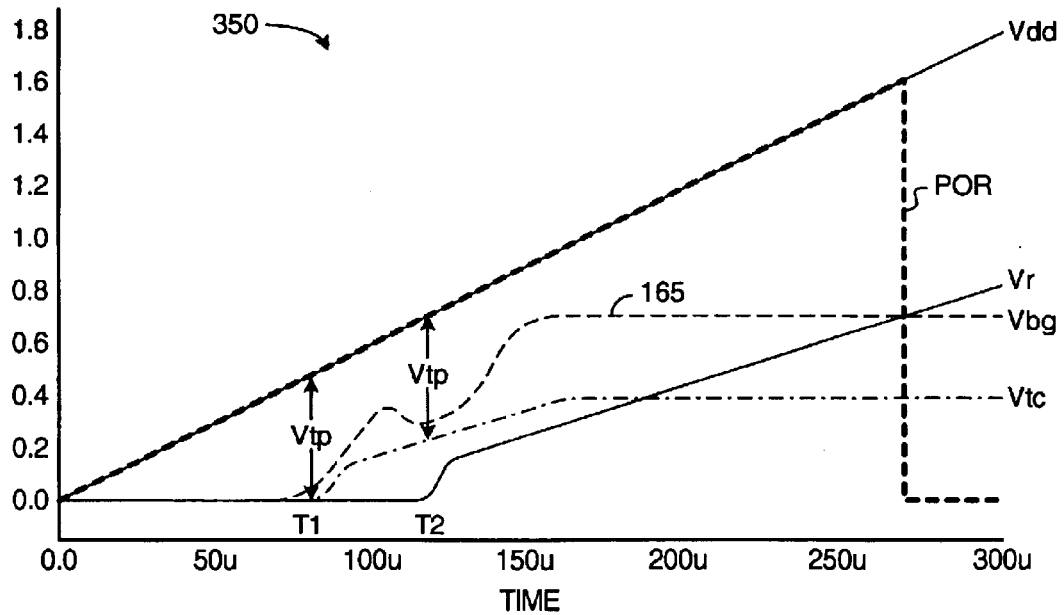
FIG. 3B depicts the response of POR circuit 300 of FIG. 3A to power applied to supply terminal vdd at time zero.

FIG. 3B is a waveform diagram 350 depicting the response of POR circuit 300 to power applied to supply terminal vdd at time zero. As in the example of FIG. 2B, supply voltage vdd rises linearly from zero to 1.8 volts over about 300 microseconds. A conventional start-up circuit (not shown) provides a POR-start-up signal PORsu to the control terminal of an NMOS transistor N1. Signal PORsu briefly pulls line vp low to start POR circuit 300 and then turns of transistor N1 to allow differential amplifier Da1 to establish the bias voltage for PMOS transistors P1, P2, and P3.

When Vdd rises high enough to forward bias PMOS transistors P1, P2, and P3, transistor P1 provides current I1b through voltage divider R5, causing control signal Vtc to rise abruptly (time T1). Later, when Vdd reaches Vtc plus Vtp (vdd=vtc+vtp) to forward bias transistor 315, reference signal Vr rises abruptly (time T2). With both of transistors P1 and 315 forward biased, reference signal Vr rises linearly with supply voltage vdd.

Reference signal Vr, in comparison to reference signal Va of conventional POR circuit 200 of FIGS. 2A and 2B, exhibits two noteworthy characteristics. First, reference signal Vr does not rise with Vdd until BGR signal Vbg has progressed significantly toward its ultimate reference level, and thus avoids crossing BGR signal Vbg to produce undesirable windows. Second, the time at which reference signal Vr begins to rise (e.g. time T2) is inversely proportional to temperature; consequently, as the Vbg curve moves to the right (later in time), so too does the curve associated with reference signal Vr. The values of resistors R6a and R6b within voltage divider R6 are selected to achieve a desired cross-over point for reference voltages Vbg and Vr; the sum of the values of resistors R5a and R5b is equal to R2b, and the ratio of R5a and R5b is selected to establish a desired time for the second reference signal vr to begin rising. The values of the various components of BGR circuit 300 will vary depending on the application. Selecting appropriate values is well within the skill of those in the art.

While the present invention has been described in connection with specific embodiments, variations of these embodiments will be obvious to those of ordinary skill in the art. For example, while a BGR circuit is modified in the foregoing examples to provide the temperature-compensated reference signal Vtc, alternative methods of providing the requisite temperature compensation might also be used. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A power-on-reset (POR) circuit comprising:
   a first power-supply terminal receiving a first power-supply signal and a second power-supply terminal receiving a second power-supply signal, wherein applying power to the POR circuit produces a rising potential difference between the first and second power-supply terminals, the potential difference rising to a power-supply voltage over a power-us time;
   a band-gap reference circuit connected between the first and second power-supply terminals and having a bandgap-reference output terminal providing a band-gap-reference signal, wherein the band-gap-reference signal is substantially constant with variations in temperature and the power-supply voltage;

a second reference circuit connected between the first and second power-supply terminals and having a second-reference-circuit output terminal providing a second reference signal, wherein the second reference signal is non-linear with respect to the rising potential difference; and a differential amplifier having a first differential-amplifier input terminal connected to the band-gap-reference output terminal and a second differential amplifier input terminal connected to the second-reference-circuit output terminal, wherein the second reference circuit includes a control terminal receiving a temperature-compensated control signal, and wherein the temperature-compensated control signal varies with changes in the temperature and is, after the power-up time, substantially constant with variations in the power-supply voltage, wherein the second reference circuit includes:
a diode having first and second diode terminals; and
a voltage divider having a first voltage-divider terminal connected to the first diode terminal, a second voltage-divider terminal connected to the second diode terminal, and an intermediate voltage-divider terminal providing the temperature-compensated control signal.

2. The POR circuit of claim 1, wherein the second reference circuit further includes a transistor having a first current-handling terminal connected to the first power-supply terminal, a second current-handling terminal, and a control terminal connected to the intermediate voltage-divider terminal.

3. The POR circuit of claim 2, wherein the second current-handling terminal connects to the second power-supply terminal via at least one resistor.

4. The POR circuit of claim 2, wherein the second current-handling terminal connects to the second differential-amplifier input terminal via at least one resistor.

5. The POR circuit of claim 4, wherein the band-gap reference circuit comprises:
a second differential amplifier having third and fourth differential-amplifier input terminals.

6. The voltage reference circuit of claim 5, further comprising:
a second diode having third and fourth diode terminals; and
a second voltage divider having a third voltage-divider terminal connected to the third diode terminal, a fourth voltage-divider terminal connected to the fourth diode terminal, and a second intermediate voltage-divider terminal connected to the fourth differential-amplifier input terminal.

7. The voltage reference circuit of claim 6, further comprising a third diode connected in parallel with the second diode.

8. The voltage reference circuit of claim 5, wherein the second differential amplifier includes a pair of input transistors, each input transistor including a control terminal connected to a respective one of the third and fourth differential-amplifier input terminals, and wherein each of the first and second input transistors exhibits a threshold voltage greater then half the power-supply voltage.

9. The POR circuit of claim 5, wherein the band-gap-reference signal varies with changes in the temperature and is, after the power-up time, substantially constant with variations in the power-supply voltage.

* * * * *